(12) United States Patent
Grasset

(10) Patent No.: US 6,594,504 B1
(45) Date of Patent: Jul. 15, 2003

(54) FREQUENCY TRANSPOSITION DEVICE HAVING LOW LOCAL OSCILLATOR SIGNAL LEAKAGE AND CORRESPONDING LEAKAGE REDUCTION PROCESS

(75) Inventor: Jean-Charles Grasset, Moirans (FR)

(73) Assignee: STMicroelectronics S.A., Gentilly (FR)

( * ) Notice: Subject to any disclaimer, the term of this patent is extended or adjusted under 35 U.S.C. 154(b) by 316 days.

(21) Appl. No.: 09/650,021

(22) Filed: Aug. 28, 2000

(30) Foreign Application Priority Data

Sep. 3, 1999 (FR) ............................................. 99 11089

(51) Int. Cl.[7] ............................. H03F 3/45; H04B 1/38; H04B 1/26
(52) U.S. Cl. ...................... 455/550; 455/333; 455/313; 330/254
(58) Field of Search ................................ 455/333, 323, 455/313, 296, 310, 319, 326; 327/113, 359, 355, 361; 307/263, 271, 355; 379/121.02; 330/254, 252

(56) References Cited

U.S. PATENT DOCUMENTS

| 4,590,616 A | * | 5/1986 | van Glabbeek | 455/319 |
|---|---|---|---|---|
| 4,922,127 A | * | 5/1990 | Denny | 327/247 |
| 5,157,350 A | | 10/1992 | Rubens | 330/254 |
| 5,196,742 A | * | 3/1993 | McDonald | 327/65 |
| 5,410,744 A | * | 4/1995 | Rinderle et al. | 455/333 |
| 5,438,693 A | * | 8/1995 | Cox | 455/333 |
| 5,532,637 A | * | 7/1996 | Khoury et al. | 327/359 |
| 5,715,532 A | | 2/1998 | Sagawa et al. | 455/333 |
| 5,933,771 A | * | 8/1999 | Tiller et al. | 455/333 |
| 6,029,059 A | * | 2/2000 | Bojer | 455/326 |
| 6,381,449 B1 | * | 4/2002 | Yamaji et al. | 455/313 |

FOREIGN PATENT DOCUMENTS

| EP | 0040274 | 11/1981 | ............ H04N/9/50 |
|---|---|---|---|
| EP | 0853375 | 7/1998 | ............ H03D/7/14 |

* cited by examiner

Primary Examiner—Vivian Chin
Assistant Examiner—Kamran Afshar
(74) Attorney, Agent, or Firm—Lisa K. Jorgenson; Allen, Dyer, Doppelt, Milbrath & Gilchrist, P.A.

(57) ABSTRACT

The residual quantity of a local oscillator signal in the output signal from a frequency transposition device having a differential Gilbert type structure is reduced by biasing the transistors of the output stage of the differential transconductor block of the device. The biasing is performed by carrying out differential slaving of the conduction terminal of these transistors to a predetermined common mode current.

32 Claims, 4 Drawing Sheets

FREQUENCY TRANSPOSITION DEVICE HAVING LOW LOCAL OSCILLATOR SIGNAL LEAKAGE AND CORRESPONDING LEAKAGE REDUCTION PROCESS

FIELD OF THE INVENTION

The present invention relates to frequency transposition and, more particularly, to radio frequency transposition such as in a mobile telephone. In mobile telephones, radio-frequency circuits make wide use of frequency transposition devices (mixers), both on transmission and reception of information signals.

BACKGROUND OF THE INVENTION

During transmission of an information signal, the purpose of a frequency mixer, which in this instance is a frequency raising circuit, is to transpose the information signal into a baseband signal around a transmission carrier signal. On reception of the information signal, the frequency mixer is a frequency lowering arrangement.

The frequency transposition function is critical, both on account of its conventional limitations (e.g., linearity, power consumption, noise factor), and also because of the isolation of the signal originating from the local oscillator towards the output signal from the mixer. The residual quantity of a local oscillator signal in the output signal from the mixer must be minimized to make it easier to recover the carrier signal.

As an illustration, if the input signal is at a frequency between 100 and 400 MHz, and to produce an output signal around 1 or 2 GHz, the local oscillator signal, which is locked onto a frequency of about 1 or 2 GHz, is close to the synthesized carrier signal at the output. The subsequent filtering of the local oscillator signal is often difficult, at least at an acceptable cost.

The leakage of the local oscillator signal to the output signal, which is to be minimized, is called a structural leakage, i.e., it is intrinsic to the mixer. Another cause of leakage that is conventionally encountered occurs between the input of the local oscillator on the chip containing the mixer, and the output of the mixer by way of the parasitic elements of the package. This leakage can be easily addressed with modern packaging.

FIG. 1 illustrates the structure customarily used for frequency transposition devices. In the top part of FIG. 1, the reference DTF designates a frequency transposition device, or mixer, which is also referred to herein as a frequency raiser. The frequency raiser includes an input terminal BE for receiving an input signal at an intermediate frequency IF, which may be 200 MHz, for example, and an input terminal BO for receiving the local oscillator signal LO, which may be 2 GHz, for example. An output terminal BS delivers the output signal whose frequency spectrum exhibits a line at the frequency LO−IF and a line at the frequency LO+IF. The dashed arrow illustrates the structural leakage of the oscillator signal LO to the output signal.

The structure customarily used for these mixers is a differential GILBERT type, as illustrated in the bottom part of FIG. 1. More precisely, such a structure comprises a differential transducer block BTC for converting the input signal (voltage) present on the terminals BE into a differential current. This block BTC also comprises a stage forming the output stage, and includes a differential pair of transistors T1 and T2, whose respective bases are linked to the input terminals BE by two capacitors C6 and C7. The collectors of the two transistors T1 and T2 of the output stage form the output terminals of this transducer block BTC. Alternatively, the block BTC may comprise several stages.

A resistor RP, contributing to defining the transductance value of the block, is connected between the emitters of the transistors T1 and T2. The transistors T1 and T2 are biased by biasing means MPL which includes two current sources SC1 and SC2 connected respectively between ground and the two terminals of the resistor RP. The biasing means MPL also comprises two base resistors RB1 and RB2, both connected to a voltage source ST. This connection forms a return path for the base currents of the transistors T1 and T2.

At the output of the transconductor block BTC, i.e., the collectors of the transistors T1 and T2 of the output stage, a current switching block BCC is connected for shunting the current alternately to one of the two output terminals BS at the frequency of the local oscillator signal LO received at the terminals BO. This block BCC conventionally comprises two pairs of transistors Q3, Q4 and Q5, Q6.

Each resistor ZL, connected between the output terminals BS of the block BCC and the supply Vcc, represents the output load of the mixer DTF. The transconductor BTC, which is formed by transistors T1 and T2 and resistor RP, and which is also used to define the transconductance of the block BTC, converts the power or the voltage applied to the input BE into a differential current. This differential current is an image, assumed linear, of the input signal. This linear signal is then chopped by a nonlinear square function (+1, −1, +1, −1 . . . ) carried out by the double switch BCC at the frequency of the signal LO. The double switch acts as a dynamic shunter of the current. The output signal is gathered at the terminals of the differential load 2ZL.

In the first instance, it is shown that the output is a balanced structure that generates an output signal free of the local oscillator signal residual. However, this absence of the local oscillator signal in the output signal relies on a perfectly differential structure. In practice, a residual quantity of the local oscillator signal exists in the output signal by reason of an imperfectly differential structure. Stated otherwise, the symmetric elements of the structure do not posses identical characteristics after fabrication on silicon, i.e, they are not matched.

A common cause is poor matching of the parasitic capacitances of the current switch and/or of the two output load impedances ZL. The present invention provides an approach to this problem by adopting a radically different approach from that of the prior art, which reduced the lack of dynamic matching of the structure, i.e., the lack of capacitive and resistive matching.

The dominant cause of the lack of matching of the differential structure in not from a lack of dynamic matching, but from a lack of static matching, and more particularly, from poor matching of the quiescent currents of the differential structure.

SUMMARY OF THE INVENTION

An object of the present invention is to better match the quiescent or bias currents of the differential pair of transistors of the output stage of the transconductor block BTC. In other words, the object of the present invention is to better match the emitter currents of these transistors.

The biasing means conventionally used, such as illustrated in FIG. 1 under the reference MPL, exhibit numerous causes leading to an absence of matching. One of these causes results from the poor matching of the two current sources SC1 and SC2. Moreover, when the transistors T1 and T2 are biased to high current levels (a few mA to 10 mA) they easily develop offset voltages from 5 to 10 mV. The matching of the bias currents depend not only on the matching of the respective factors β of the transistors, but also on the matching of the respective offset voltages of these transistors.

Moreover, the base bias resistors RB1 and RB2 induce a lack of matching, which is very sensitive on account of the base current offset (poor matching of the DC gains). This is found in bipolar transistors, particularly in high speed devices. The orders of magnitude are such that the lack of matching of the output currents is from 5 to 10% if one assumes a lack of matching of the gains of the transistors of 10%. The situation may be worse when the matching of the gains is yet further degraded to around 20% or 30%, as is sometimes the case in high speed devices.

The invention therefore matches the quiescent currents of the structure to reduce the residual quantity of the local oscillator signal in the output signal from such a mixer. This is done by performing differential slaving of the quiescent currents of the output stage of the transconductor block accompanied by common mode control.

According to the invention, the transistors of the output stage of the differential transconductor block of the structure are biased by carrying out differential slaving of the emitter currents (for bipolar technology or source currents for MOS technology) of these transistors to a predetermined common mode current. That is, the difference of the values of the two emitter currents is slaved to zero while slaving the value of each of these currents to a predetermined value. The predetermined value is the value of the common mode current.

Stated otherwise, the differential slaving of the two emitter currents or source currents of the output stage of the transconductor block renders these two quiescent currents equal. Thereby, the matching of the two output currents, which are the two collector currents, then depends on the lack of matching Δβ of the two transistors only in a ratio $1/\beta_2$. Thus, for usual values of β on the order of 50, and a ratio Δβ/β which even at the worst is on the order of 0.5, a matching of the collector currents of the transistors T1 and T2 to within 1% is obtained.

This being so, it is necessary, not only for the two bias currents to be equal, but it is also necessary for them to be equal to a common mode current set in advance. This is the reason why common mode control or slaving is also performed. The bias or quiescent currents are the emitter currents in the absence of a signal (intermediate frequency or radio-frequency) at the input of the transconductor block. The emitter currents in the presence of an input signal are different from the quiescent emitter currents.

The average of the signal received at the input is zero, and the variations in the emitter currents which are corrected by the slaving loop according to the invention are not the variations due to the input signal. These variation are from the process (lack of matching), and from temperature variations, etc. These variations which occur as soon as the mixer is energized, are corrected by the slaving loop with a time constant that is relatively large in relation to the temporary variations of the input signal.

Accordingly, within the meaning of the present invention and in the subsequent text, the input signal is ignored and the emitter or source currents, which are slaved are regarded even in the presence of input signal, are the bias or quiescent currents of the respective transistors.

According to one mode of implementation of the invention, the differential slaving is carried out by looping back directly or indirectly between the emitters (sources) and the bases (gates) of the transistors of the output stage of the transconductor block. A differential amplifier, preferably with transconductance (current output) whose input stage comprises two transistors having linked bases (gates), and the common mode current is fixed by applying a reference voltage to the linked bases (gates) of the transistors of the differential amplifier. This makes it possible to apply a relatively small voltage to the emitters of the transistors of the output stage of the transconductor block.

When the transconductor block comprises just one stage, which is both the input stage and the output stage, the looping back of the differential amplifier is direct. That is, the output of the amplifier is connected directly to the bases of the transistors of the transconductor block.

When the transconductor block comprises at least two mutually linked stages, i.e., at least one input stage and one output stage, the looping back of the amplifier is indirect. The output of the amplifier is connected to one of the electrodes of the transistors of the input stage of the transconductor block. The output is also consequently connected indirectly to the bases of the transistors of the output stage by way of the transistors of the input stage, and possibly by way of the transistors of the intermediate stages.

Such a mode of implementation thus also makes it possible to use just a single differential amplifier to carry out both the differential slaving of the emitter currents to the common mode current, and to fix this common mode current. Such an approach is distinguished from another approach, also possible, which would include using a differential amplifier to carry out the slaving of the emitter currents to the common mode current, and a separate slaving loop carrying out the slaving of the common mode. That is, the value of the common mode current is fixed.

It would be possible to apply the reference voltage to the linked bases (gates) of the transistors of the differential amplifier by using a reference voltage source directly. However, in this case, the value of the quiescent current depends on the base-emitter (gate-source) voltage drop of the transistors of the input stage of the differential amplifier. This voltage drop is not temperature-stable. Hence, it is preferable, in certain applications, to apply the reference voltage to the linked bases of the transistors of the differential amplifier from a reference current source and from a reference resistor mutually connected by a current mirror. The base of one of the transistors is connected to the linked bases of the transistors of the differential amplifier. The formula giving the bias current is then independent of a base emitter voltage drop of a bipolar transistor, or a gate-source voltage drop of an insulated-gate field-effect transistor.

Although it would be possible to bias the transistors of the input stage of the differential amplifier with a bias current emanating from a current source separate from the reference current source, it is preferable, for matching reasons, to bias these transistors with a bias current emanating from the reference current source. This bias current can then be equal to the reference current emanating from the reference current source, or else equal to a fraction of this reference current.

The subject of the invention is also a frequency transposition device of the type comprising a differential transconductor block for converting an input signal into a differential current, and a differential output stage with two transistors. A bias circuit biases the transistors of the output stage. A current switching circuit is controlled by a local oscillator signal, and is connected between the output stage of the transconductor block and the output terminal of the device.

According to a general characteristic of the invention, the biasing circuit comprises bias means for generating a predetermined common mode current, and slaving means for carring out a differential slaving of the emitter currents or source currents of the transistors of the output stage of the transconductor block to the common mode current.

According to one embodiment of the invention, the slaving means comprises a differential amplifier with transconductance comprising an input stage with two transistors whose bases are linked together, whose emitters are linked respectively to the emitters of the transistors of the output stage, and whose collectors are looped back directly or indirectly to the bases of the transistors of the output stage.

Moreover, the means for generating the common mode current comprise a voltage source delivering a predetermined voltage to the linked bases of the transistors of the input stage of the differential amplifier, as well as two bias resistors connected between ground and the emitters of the transistors of the output stage of the transconductor block.

According to a particularly advantageous embodiment of the invention, the reference voltage source comprises a reference current source delivering a predetermined reference current, a reference resistor connected to ground, and a current mirror connected between the reference current source, the reference resistor and the linked bases of the transistors of the input stage of the differential amplifier.

The subject of the invention is also applicable to a cellular mobile telephone, which comprises a frequency transposition device as defined herein.

BRIEF DESCRIPTION OF THE DRAWINGS

Other advantages and characteristics of the invention will become apparent on examining the detailed description of non-limiting modes of implementation and embodiments, and the appended drawings, in which.

DETAILED OF THE PREFERRED EMBODIMENTS

Figure 1:
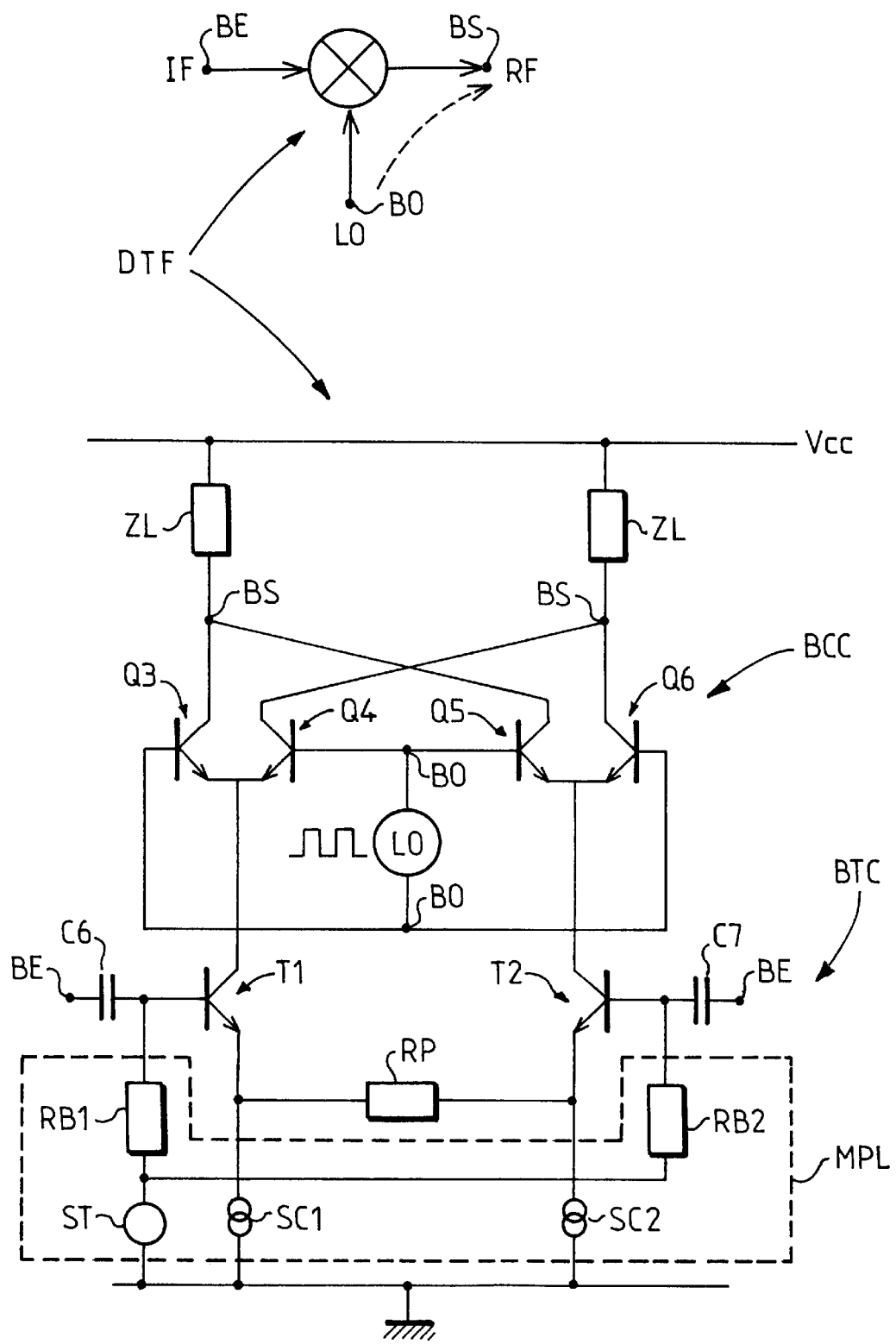
FIG. 1 is a schematic diagram illustrating a frequency transposition device equipped with biasing means according to the prior art.
Figure 2:
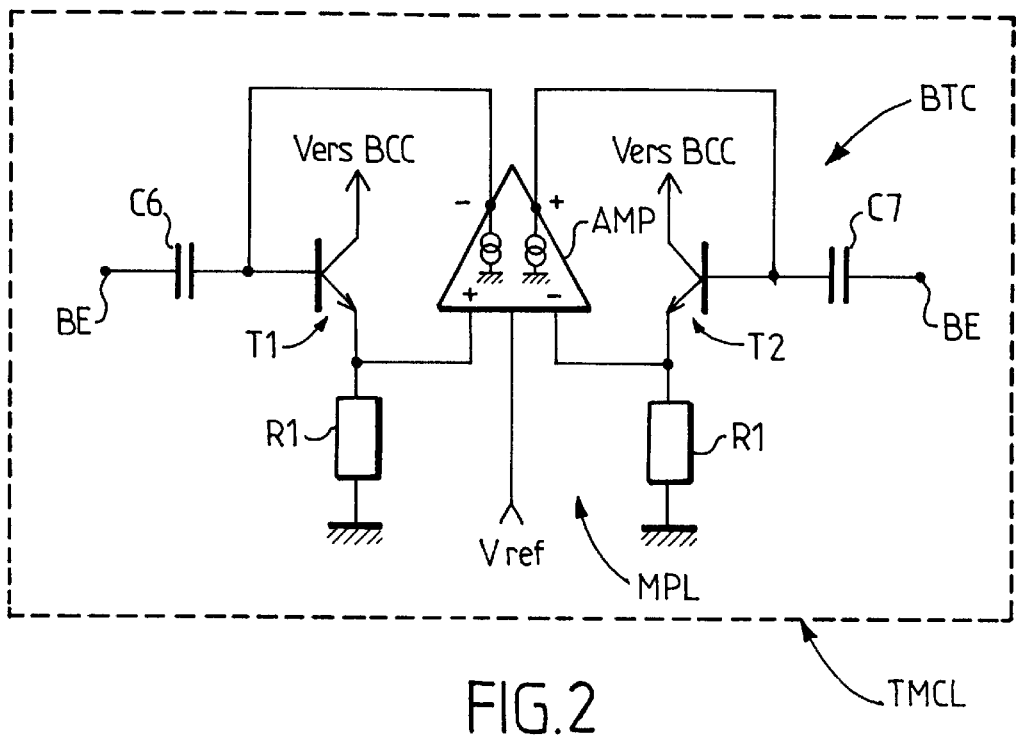
FIG. 2 is a schematic diagram illustrating the biasing means that allows differential slaving accompanied by common mode control according to the present invention.

FIG. 2 illustrates the output stage T1 and T2 of the transconductor block BTC equipped with biasing means MPL. The remainder of the structure of the frequency transposition device, in particular, the current switching block BCC, is identical to that as illustrated in FIG. 1. This frequency transposition device may be incorporated into a cellular mobile telephone TMCL. In FIG. 2 the other conventional elements of a mobile telephone have not been represented to simplify the drawing.

In FIG. 2, the reference AMP designates overall a differential amplifier with transconductance looped back between the emitters and the bases of the transistors T1 and T2. Moreover, the biasing means comprise two bias resistors which are assumed to be identical and are indicated by reference R1. These bias resistors are connected between the emitters of the transistors T1 and T2 and ground. The resistors R1 serve also to fix the transconductance value of the output stage of the block BTC.

With this being so, it is possible to decouple the bias function and transconductance function, which are related here by the same resistor R1, by connecting between the emitter of each transistor T1 and T2 and the base, a bias resistor. Connected in parallel to the terminals of this bias resistor is a capacitor in series with another resistor, which would make it possible to fix the transconductance value.

In the present case, even though the resistors R1 simultaneously ensure bias and transconductance functions, we are now interested only in the bias function. In FIG. 2, the reference Vref designates a reference voltage which, when applied via a differential amplifier AMP, makes it possible to fix the common mode current $I_0$. This is the emitter current when quiescent, i.e., in the absence of any input signal or bias current.

Figure 3A:
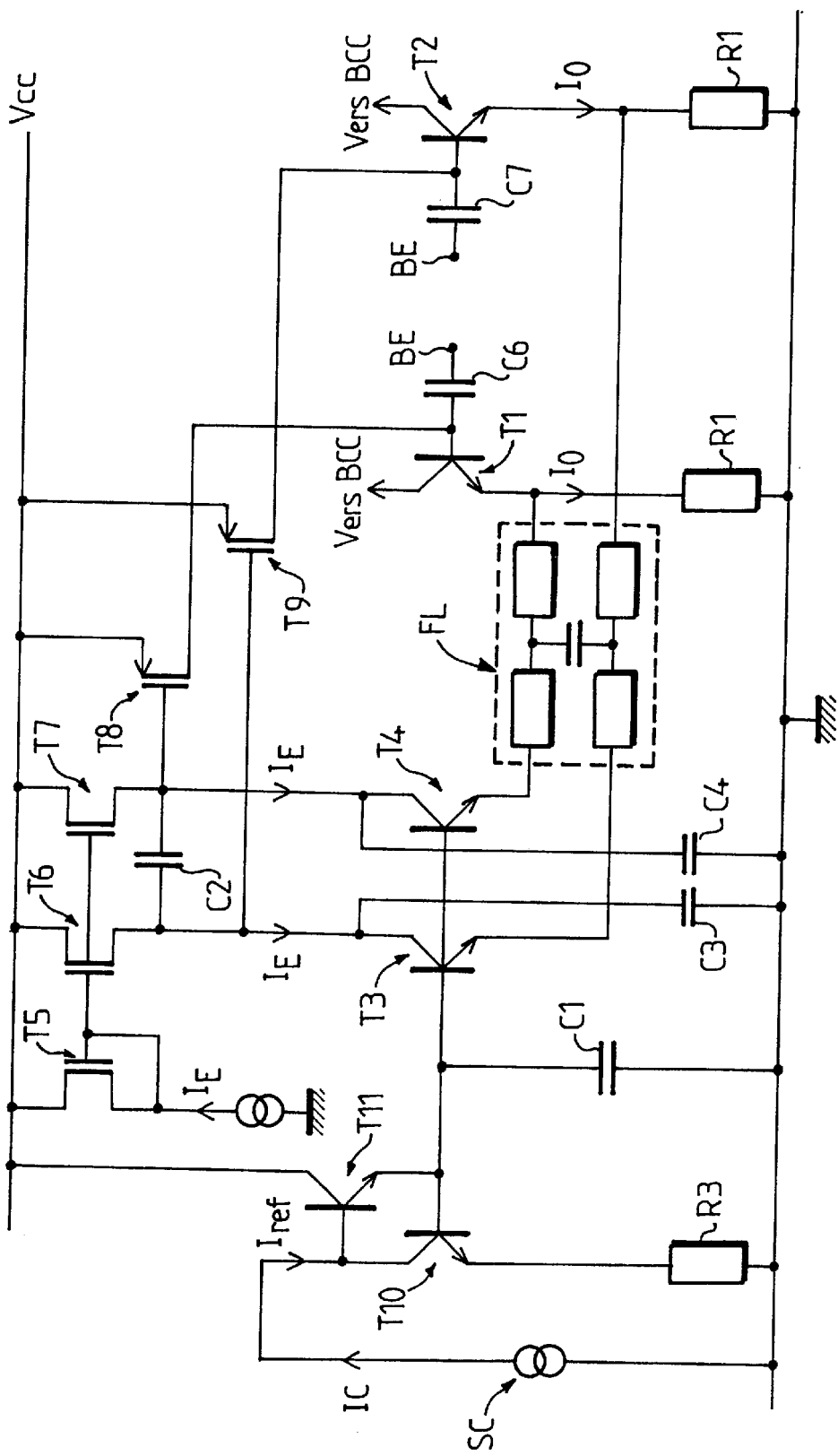
FIGS. 3a and 3b are schematic diagrams illustrating in greater detail the internal structure of the biasing means of FIG. 2.

The function of the differential slaving and of the common mode control is to fix the value $I_0$ of the common mode current and to slave each of the emitter currents of the transistors T1 and T2 to this value $I_0$. As illustrated in FIG. 3a, the differential amplifier AMP is made up of an input stage comprising a differential pair of bipolar transistors T3 and T4. These transistors have their emitters linked respectively to the emitters of the transistors T1 and T2 of the output stage of the transconductor block BTC. These transistors have their collectors looped back to the bases of the transistors T1 and T2 by way of the output stage of this differential amplifier. The differential amplifier is made up of two PMOS transistors T8 and T9.

The transistors T8 and T9 contribute to obtaining the gain of the differential amplifier and provide the transistors T1 and T2 with the base current. Moreover, the differential amplifier AMP comprises two other NMOS transistors T6 and T7 which form a dynamic load for the transistors T3 and T4 and which allow the biasing of these transistors. More precisely, the transistors T6 and T7 make up the two outputs of a current mirror whose input is made up of a third NMOS transistor T5. The current mirror thus makes it possible to bias the transistors T3 and T4 with a current $I_E$. This current $I_E$ is equal to $xI_{ref}$ where $I_{ref}$ is the current delivered by a current source SC.

Figure 3B:
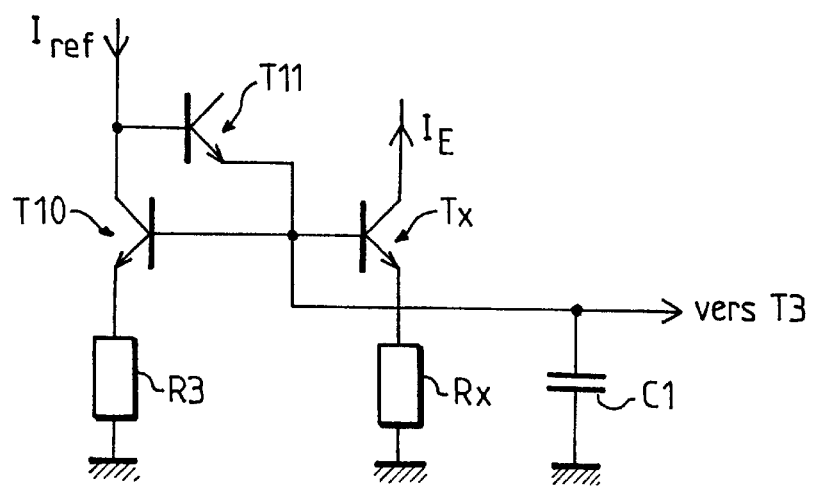

It would be possible to use a current source separate from SC to generate the current $I_E$. However, for matching reasons, it is preferable for the current $I_E$ to emanate from the current source SC. An example of such an arrangement is illustrated in FIG. 3b. In this figure, a transistor Tx, biased by a resistor Rx, is between the base of the transistor T10 and the transistor T5. The characteristics of the transistor Tx and the value of the resistor Rx can be tailored by one skilled in the art to obtain the desired value of x.

The differential amplifier makes it possible to slave the emitter currents of the transistors T1 and T2 to the same value. If it is assumed, for example, that at a given instant the emitter current of the transistor T1 is greater than the emitter current of the transistor T2, it follows that the collector current of the transistor T4 is less than the collector current of the transistor T3. Consequently, the gate voltage of the transistor T8 is greater than the gate voltage of the transistor T9. The transistor T8 then conducts less than the transistor T9.

This therefore results in a decrease of the current in the base of the transistor T1. This translates into a fall in the emitter current of the transistor T1 until the latter becomes equal to the emitter current of the transistor T2. The fixing of the quiescent or bias current $I_0$ of the transistors T1 and T2 is achieved by applying a reference voltage Vref to the linked bases of the transistors T3 and T4 of the differential amplifier.

The application of this reference voltage is carried out from the current source SC, from a reference resistor R3 and from a current mirror made up of the transistors T10 and T11. The current mirror is connected between the current source SC and the resistor R3. Moreover, the base of the transistor T10 is connected to the linked bases of the transistors T3 and T4.

It therefore follows, if it is assumed that the current $I_E$ is equal to the current $I_{ref}$ flowing in the resistor R3, that the quiescent current $I_0$ is equal to $I_{ref}(R3/R1-1)$. It may therefore be seen that the current $I_0$ does not depend on a base-emitter voltage drop of a bipolar transistor, which would have been the case if a reference voltage emanating from a voltage source had, for example, been applied directly to the bases of the transistors T3 and T4.

The final matching of the quiescent currents of the transistors of the output stage depends essentially only on the matching of the two resistors R1. Present-day technologies make it possible to achieve resistive matchings on the order of 0.5%. All the other causes for a lack of matching are divided by the gain of the slaving loop. They are therefore much lower than in a prior art structure.

Apart from the elements just described, the biasing means also comprise a capacitor C1 connected between the linked bases of the transistors T3 and T4 and grond, which allows decoupling of the bases at high frequency. Moreover, both the capacitor C2 which is connected between the collectors of the transistors T3 and T4, and the capacitors C3 and C4 which are connected respectively between the collectors of the transistors T3 and T4 and ground, allow better stability of the slaving loop at high frequency. This is the differential mode for the capacitor C2 and the common mode for the capacitors C3 and C4.

It is also possible, but not critical, to connect between the emitters of the transistors T3 and T4, and the emitters of the transistors T1 and T2, a low-pass filter FL. This makes it possible to get rid of part of the input signal. The input signal is at an intermediate frequency in the case of a frequency raising mixer, or at a frequency of the radio-frequency type in the case of a frequency lowering mixer.

Figure 4:
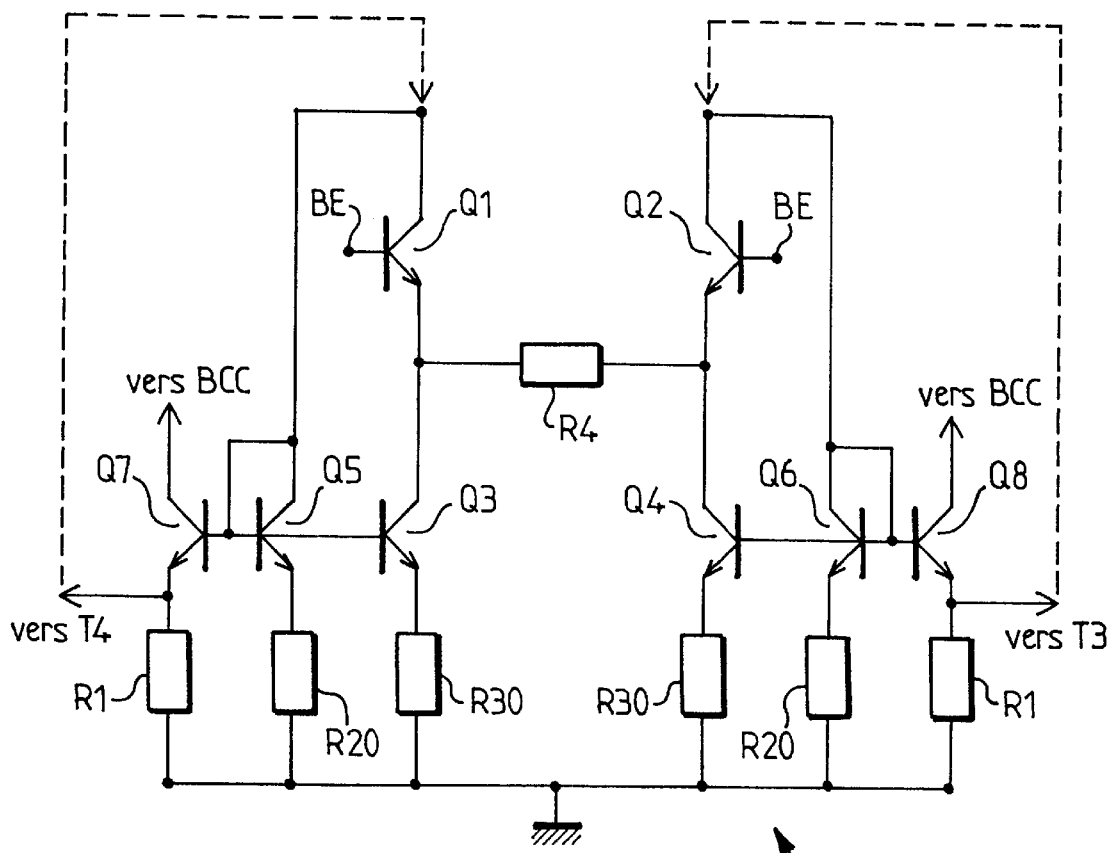
FIG. 4 is a schematic diagram illustrating a variation of the transconductor block according to the present invention.

In FIG. 3a, the transconductor block comprises just a single stage composed of the transistors T1 and T2. FIG. 4 illustrates the essential elements of a transconductor block comprising an input stage made up of the transistors Q1 and Q2, an output stage made up of the transistors Q7 and Q8, and an intermediate stage made up of the transistors Q3, Q4 and Q5, Q6. The differential slaving amplifier, represented by dashed lines in FIG. 4, is connected between the emitters of the transistors of the output stage Q7, Q8 and the collectors of the transistors Q1, Q2 of the input stage. This looping back is consequently indirect to the bases of the transistors Q7 and Q8. It would also be possible, in a more general manner, to connect the differential amplifier to one of the electrodes (base, collector, emitter) of the transistors of the input stage.

Figure 5:
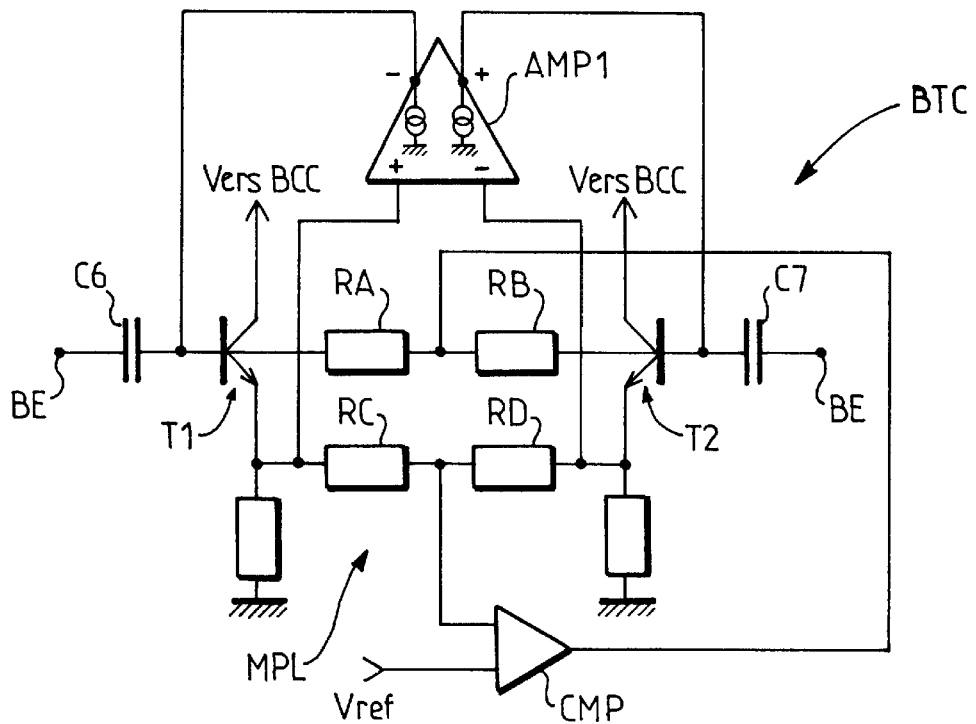
FIG. 5 is a schematic diagram illustrating another variation of the transconductor block according to the present invention, also making it possible to carry out differential slaving of the emitter currents of the transistors of the output stage of the transconductor block to a predetermined common mode current.

Instead of adjusting the common mode current by way of the differential amplifier AMP, it would also be possible, as illustrated in FIG. 5, to provide a separate common mode slaving loop for adjusting the value of the current $I_0$. More precisely, the differential amplifier AMP1 still remains looped back between the emitters and the bases of the transistors T1 and T2 of the output stage of the transconductor block BTC. The additional slaving loop comprises a linear amplifier CMP, one of whose inputs receives the reference voltage Vref and whose other input is connected to the midpoint of a resistive bridge RC and RD disposed between the emitters of the transistors T1 and T2.

Moreover, the,output of the amplifier CMP is connected to the midpoint of another resistive bridge RA and RB connected between the bases of the transistors T1 and T2. However, such an arrangement requires a larger area of silicon than the arrangement of FIG. 2. The embodiments and modes of implementation just described use npn bipolar transistors.

The invention may also be formed with pnp transistors or with MOS transistors. The emitters, bases and collectors of the bipolar transistors becoming respectively the sources, gates and drains of the MOS transistors. Moreover, the biasing means according to the invention which have been described hereinabove is not limited to the particular application of a mixer, but make it possible to bias in general any differential pair of transistors for the purpose of obtaining the advantages alluded to above.

That which is claimed is:

1. A mixer comprising:
   a differential input stage for converting an input voltage into a current;
   a differential output stage comprising a first pair of transistors connected to said differential input stage, each transistor comprising a first conduction terminal; and
   a biasing circuit for biasing said first pair of transistors, said biasing circuit comprising
      a common mode circuit for generating a common mode current, and
      a slave circuit for performing a differential slaving of a conduction terminal current in the respective first conduction terminals of said first pair of transistors to the common mode current.

2. A mixer according to claim 1, further comprising:
   a pair of output terminals; and
   a current switching circuit connected between said differential output stage and the pair of output terminals, said current switching circuit being controlled by a local oscillator signal.

3. A mixer according to claim 1, wherein said differential input stage comprises a differential transconductance input stage; and wherein said differential output stage comprises a differential transconductance output stage.

4. A mixer according to claim 1, wherein said first pair of transistors each comprises a control terminal; and wherein said slave circuit comprises a differential amplifier comprising an amplifier input stage; wherein said amplifier input stage comprises a second pair of transistors, each transistor of the second pair of transistors comprising a control terminal, a first conduction terminal, and a second conduction terminal, the control terminals being connected together, the first conduction terminals being respectively connected to the first conduction terminals of said first pair of transistors, and the second conduction terminals being respectively connected to the control terminals of said first pair of transistors.

5. A mixer according to claim 4, wherein said common mode circuit comprises:

a voltage circuit for providing a control voltage to the control terminals of said second pair of transistors; and a pair of bias resistors respectively connected between a first voltage reference and the first control terminals of said first pair of transistors.

6. A mixer according to claim 4, wherein said differential input stage comprises:

at least one stage comprising a third pair of transistors, each transistor comprising a first conduction terminal respectively connected to the first conduction terminals of said second pair of transistors; and at least one output stage comprising a fourth pair of transistors connected to said third pair of transistors.

7. A mixer according to claim 4, wherein said common mode circuit comprises a resistive capacitive low-pass filter connected between the first conduction terminals of said first pair of transistors and the first conduction terminals of said second pair of transistors.

8. A mixer according to claim 5, wherein said voltage circuit comprises:

a current mirror connected to the control terminals of said second pair of transistors;

a current source connected to said current mirror for providing a current thereto; and a reference resistor connected between the first voltage reference and said current mirror.

9. A mixer according to claim 8, wherein said slave circuit comprises a current mirror connected between said current source and the second conduction terminals of said second pair of transistors.

10. A mixer comprising:

a pair of input terminals and a pair of output terminals;

a differential input stage connected to the pair of input terminals for converting an input voltage into a current;

a differential output stage comprising a first pair of transistors connected to said differential input stage, each transistor comprising a first conduction terminal;

a current switching circuit connected between said differential output stage and the pair of output terminals, said current switching circuit being controlled by a local oscillator signal;

a common mode circuit for generating a common mode current; and a slave circuit for performing a differential slaving of a conduction terminal current in the respective first conduction terminals of said first pair of transistors to the common mode current.

11. A mixer according to claim 10, wherein said common mode circuit and said slave circuit define a biasing circuit for biasing said first pair of transistors.

12. A mixer according to claim 10, wherein said differential input stage comprises a differential transconductance input stage; and wherein said differential output stage comprises a differential transconductance output stage.

13. A mixer according to claim 10, wherein said first pair of transistors each comprises a control terminal; and wherein said slave circuit comprises a differential amplifier comprising an amplifier input stage; wherein said amplifier input stage comprises a second pair of transistors, each transistor of the second pair of transistors comprising a control terminal, a first conduction terminal, and a second conduction terminal, the control terminals being connected together, the first conduction terminals being respectively connected to the first conduction terminals of said first pair of transistors, and the second conduction terminals being respectively connected to the control terminals of said first pair of transistors.

14. A mixer according to claim 13, wherein said common mode circuit comprises:

a voltage circuit for providing a control voltage to the control terminals of said second pair of transistors; and a pair of bias resistors respectively connected between a first voltage reference and the first control terminals of said first pair of transistors.

15. A mixer according to claim 13, wherein said differential input stage comprises:

at least one stage comprising a third pair of transistors, each transistor comprising a first conduction terminal respectively connected to the first conduction terminals of said second pair of transistors; and at least one output stage comprising a fourth pair of transistors connected to said third pair of transistors.

16. A mixer according to claim 13, wherein said common mode circuit comprises a resistive capacitive low-pass filter connected between the first conduction terminals of said first pair of transistors and the first conduction terminals of said second pair of transistors.

17. A mixer according to claim 14, wherein said voltage circuit comprises:

a current mirror connected to the control terminals of said second pair of transistors;

a current source connected to said current mirror for providing a current thereto; and a reference resistor connected between the first voltage reference and said current mirror.

18. A mixer according to claim 17, wherein said slave circuit comprises a current mirror connected between said current source and the second conduction terminals of said second pair of transistors.

19. A cellular telephone comprising:

a circuit for providing an input signal;

a local oscillator circuit for providing a local oscillator signal; and a mixer for providing an output signal based upon the input signal and the local oscillator signal, said mixer comprising a differential input stage for converting an input voltage into a current, a differential output stage comprising a first pair of transistors connected to said differential input stage, each transistor comprising a first conduction terminal, a common mode circuit for generating a common mode current, and a slave circuit for performing a differential slaving of a conduction terminal current in the respective first conduction terminals of said first pair of transistors to the common mode current.

20. A cellular telephone according to claim 19, wherein said common mode circuit and said slave circuit define a biasing circuit for biasing said first pair of transistors.

21. A cellular telephone according to claim 19, further comprising:

a pair of output terminals; and a current switching circuit connected between said differential output stage and the pair of output terminals, said current switching circuit being controlled by the local oscillator signal.

22. A cellular telephone according to claim 19, wherein said differential input stage comprises a differential transconductance input stage; and wherein said differential output stage comprises a differential transconductance output stage.

23. A cellular telephone according to claim 19, wherein said first pair of transistors each comprises a control terminal; and wherein said slave circuit comprises a differential amplifier comprising an amplifier input stage; wherein said amplifier input stage comprises a second pair of transistors, each transistor of the second pair of transistors comprising a control terminal, a first conduction terminal, and a second conduction terminal, the control terminals being connected together, the first conduction terminals being respectively connected to the first conduction terminals of said first pair of transistors, and the second conduction terminals being respectively connected to the control terminals of said first pair of transistors.

24. A cellular telephone according to claim 23, wherein said common mode circuit comprises:
a voltage circuit for providing a control voltage to the control terminals of said second pair of transistors; and
a pair of bias resistors respectively connected between a first voltage reference and the first control terminals of said first pair of transistors.

25. A cellular telephone according to claim 23, wherein said differential input stage comprises:
at least one stage comprising a third pair of transistors, each transistor comprising a first conduction terminal respectively connected to the first conduction terminals of said second pair of transistors; and
at least one output stage comprising a fourth pair of transistors connected to said third pair of transistors.

26. A cellular telephone according to claim 23, wherein said common mode circuit comprises a resistive capacitive low-pass filter connected between the first conduction terminals of said first pair of transistors and the first conduction terminals of said second pair of transistors.

27. A cellular telephone according to claim 24, wherein said voltage circuit comprises:
a current mirror connected to the control terminals of said second pair of transistors;
a current source connected to said current mirror for providing a current thereto; and
a reference resistor connected between the first voltage reference and said current mirror.

28. A cellular telephone according to claim 27, wherein said slave circuit comprises a current mirror connected between said current source and the second conduction terminals of said second pair of transistors.

29. A method for reducing leakage of a local oscillator signal onto an output signal from a mixer, the mixer comprising a differential input stage for converting an input voltage into a current, and a differential output stage comprising a first pair of transistors connected to the differential input stage, the method comprising:
generating a common mode current for the first pair of transistors; and
performing a differential slaving of a conduction current in first conduction terminals of the first pair of transistors to the common mode current.

30. A method according to claim 29, wherein the differential slaving is performed using a slave circuit comprising a differential amplifier comprising a second pair of transistors, each transistor comprising a control terminal, a first conduction terminal, and a second conduction terminal, the control terminals being connected together; the method further comprising:
applying a reference voltage to the control terminals of the second pair of transistors for setting the common mode current; and wherein the differential slaving is performed via a path between the first conduction terminals and the control terminals of the first pair of transistors.

31. A method according to claim 30, wherein the reference voltage is applied to the control terminals of the second pair of transistors via a reference current source and a reference resistor which are mutually connected by a current mirror comprising a third pair of transistors, a conduction terminal from one of the third pair of transistors being connected to the control terminals of the second pair of transistors.

32. A method according to claim 30, further comprising biasing the second pair of transistors with a bias current from the reference current source.

* * * * *